United States Patent
Jain et al.

(10) Patent No.: US 7,145,823 B2
(45) Date of Patent: Dec. 5, 2006

(54) METHOD AND APPARATUS TO IMPLEMENT A TEMPERATURE CONTROL MECHANISM ON A MEMORY DEVICE

(75) Inventors: Sandeep K. Jain, Milpitas, CA (US); Animesh Mishra, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 193 days.

(21) Appl. No.: 10/882,553

(22) Filed: Jun. 30, 2004

(65) Prior Publication Data

US 2006/0002218 A1 Jan. 5, 2006

(51) Int. Cl.
*G11C 7/04* (2006.01)

(52) U.S. Cl. ....................... 365/211; 365/212

(58) Field of Classification Search ........ 365/212, 365/211
See application file for complete search history.

(56) References Cited

U.S. PATENT DOCUMENTS

| | | | |
|---|---|---|---|
| 4,176,556 A | | 12/1979 | Takenaka |
| 5,784,328 A | * | 7/1998 | Irrinki et al. ............. 365/222 |
| 5,805,403 A | * | 9/1998 | Chemla ...................... 361/103 |
| 5,862,170 A | | 1/1999 | Britton et al. |
| 5,873,053 A | * | 2/1999 | Pricer et al. ............... 702/130 |
| 5,875,142 A | * | 2/1999 | Chevallier ................. 365/212 |
| 6,028,805 A | | 2/2000 | Higuchi |
| 6,233,190 B1 | * | 5/2001 | Cooper et al. ............. 365/212 |
| 6,403,949 B1 | | 6/2002 | Davis et al. |
| 6,453,218 B1 | * | 9/2002 | Vergis ........................ 700/299 |
| 6,490,216 B1 | | 12/2002 | Chen et al. |
| 6,778,453 B1 | * | 8/2004 | Cooper et al. ............. 365/212 |
| 6,876,593 B1 | | 4/2005 | Shi et al. |
| 6,952,378 B1 | * | 10/2005 | Partsch et al. ............. 365/233 |
| 6,975,047 B1 | * | 12/2005 | Pippin ....................... 307/117 |
| 7,009,904 B1 | * | 3/2006 | Kim ........................... 365/211 |
| 2003/0112688 A1 | | 6/2003 | Nakashima et al. |
| 2003/0210506 A1 | * | 11/2003 | Edmonds et al. .......... 361/103 |
| 2004/0260957 A1 | * | 12/2004 | Jeddeloh et al. ............ 713/300 |
| 2004/0267409 A1 | | 12/2004 | De Lorenzo et al. |
| 2005/0105367 A1 | * | 5/2005 | Kim et al. .................. 365/226 |
| 2006/0004537 A1 | | 1/2006 | Jain et al. |
| 2006/0066384 A1 | | 3/2006 | Jain et al. |

FOREIGN PATENT DOCUMENTS

EP 0917152 A1 5/1999

OTHER PUBLICATIONS

PCT/US2005/022770 filed Jun. 24, 2005, International Search Report.

* cited by examiner

*Primary Examiner*—Richard Elms
*Assistant Examiner*—Hien N Nguyen
(74) *Attorney, Agent, or Firm*—Blakely, Sokoloff, Taylor & Zafman LLP

(57) ABSTRACT

In one embodiment, a method includes periodically charging a capacitor mounted on an electronic component; initializing a timer to count down from a counter value, once the capacitor is charged; determining if the capacitor has discharged before the timer has counted down to zero; and if the capacitor has discharged before the timer has counted down to zero then generating an interrupt.

19 Claims, 5 Drawing Sheets

METHOD AND APPARATUS TO IMPLEMENT A TEMPERATURE CONTROL MECHANISM ON A MEMORY DEVICE

FIELD OF THE INVENTION

Embodiments of the invention relate to the thermal management of electronic components. In particular, embodiments of the invention relate to a method and system for determining when an operating temperature of an electronic component is above a threshold temperature.

BACKGROUND

Many electronic components are sensitive to temperature. For example, an electronic component such as a memory device has a well-defined threshold temperature such that if the operating temperature of the device moves above the threshold temperature, then the device may fail, operate unreliably, or become damaged in some fashion. Hence, the operating temperature of an electronic component has to be controlled so that it remains below the threshold temperature.

Accordingly, there are thermal management systems to detect when an operating temperature of an electronic component is above the threshold temperature, and to take steps to bring the operating temperature back to below the threshold temperature.

In at least one such thermal management system known to the inventor, the operating temperature of the electronic component is determined using a temperature sensor that measures a voltage or voltage differential, for example, across two junctions in a diode, to determine the operating temperature. Since the voltage or voltage differential is small, such a temperature sensor has to have complex electronics to detect the voltage/voltage differential. This pushes up the cost of the temperature sensor. Further, the temperature sensor has to be periodically read or sampled by a controller in order to get the latest value for the operating temperature. Having to periodically sample the temperature sensor has the effect of reducing the number of memory cycles in a given period.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
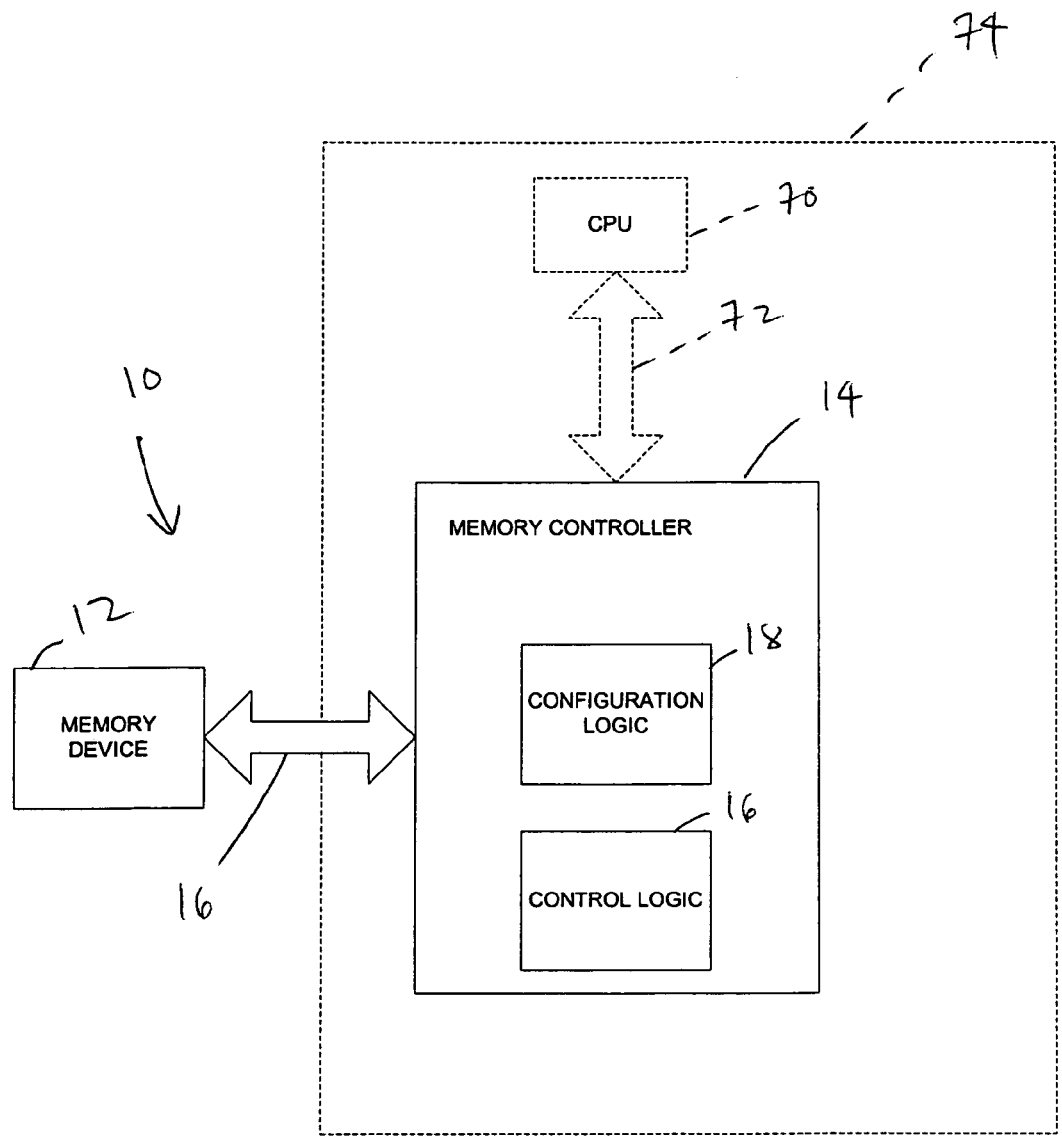
FIG. 1 shows a high-level block diagram of a system which includes a memory device, and a memory controller, in accordance with one embodiment of the invention.

FIG. 1 of the drawings shows a high-level block diagram of a system 10, in accordance with one embodiment of the invention. The system 10 includes a memory device 12 which is coupled to a memory controller 14 via a communications path 16, which in accordance with one embodiment of the invention may include a bus.

Figure 2:
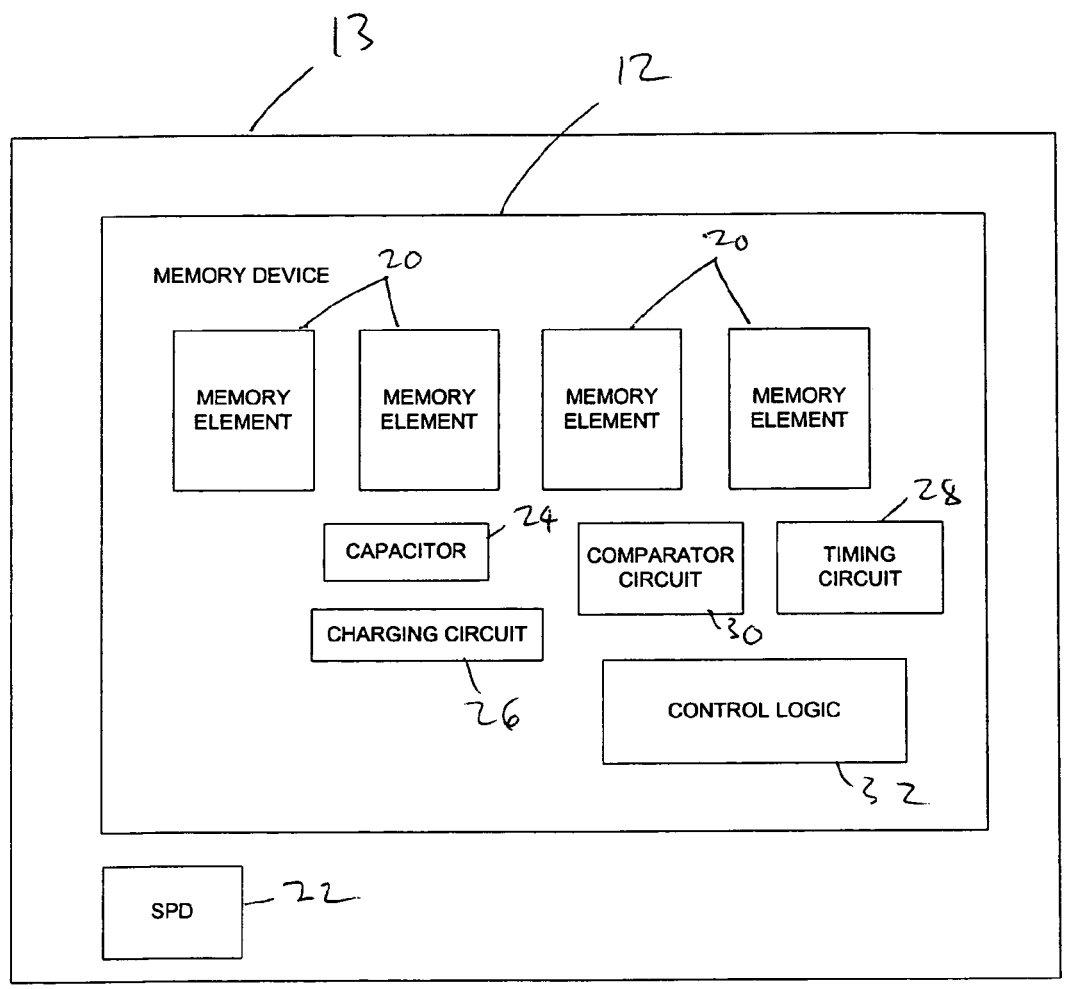
FIG. 2 shows a functional block diagram of some of the components of the memory device 12, in accordance with one embodiment of the invention.

In accordance with one embodiment of the invention, the memory device 12 may include the architecture shown in FIG. 2 of the drawings. Referring to FIG. 2, it will be seen that the memory device 12 includes a plurality of memory elements 20, only four of which have been shown in FIG. 2. The memory elements 20 may be architected in accordance with any memory technology, and may for example be DRAM elements, SRAM elements, DDR DRAM elements, etc. The memory device 12 is mounted on a printed circuit board (PCB) 13. In one embodiment, a number of memory devices 12 may be coupled to form an array on memory devices 12 mounted on the printed circuit board (PCB) 13. A serial presence detect (SPD) device 22, which is essentially an electrically erasable programmable read only memory (EEPROM) device that stores critical parameter information about the memory device 12, is mounted on the PCB 13. For example, these parameters may include memory type, size, speed, voltage interface, number of rows, column addresses, element banks, and other critical information. The parameter information is sent over the communications path 16 to the memory controller 14 in order to facilitate configuration of the system 10. As will be seen, the memory device 12 also includes a capacitor 24, a charging circuit 26, a timing circuit 28, and a comparator circuit 30. Control logic 32 includes control routines to control the operations of the various circuits of the memory device 12, as will be explained in greater detail below.

Figure 3:
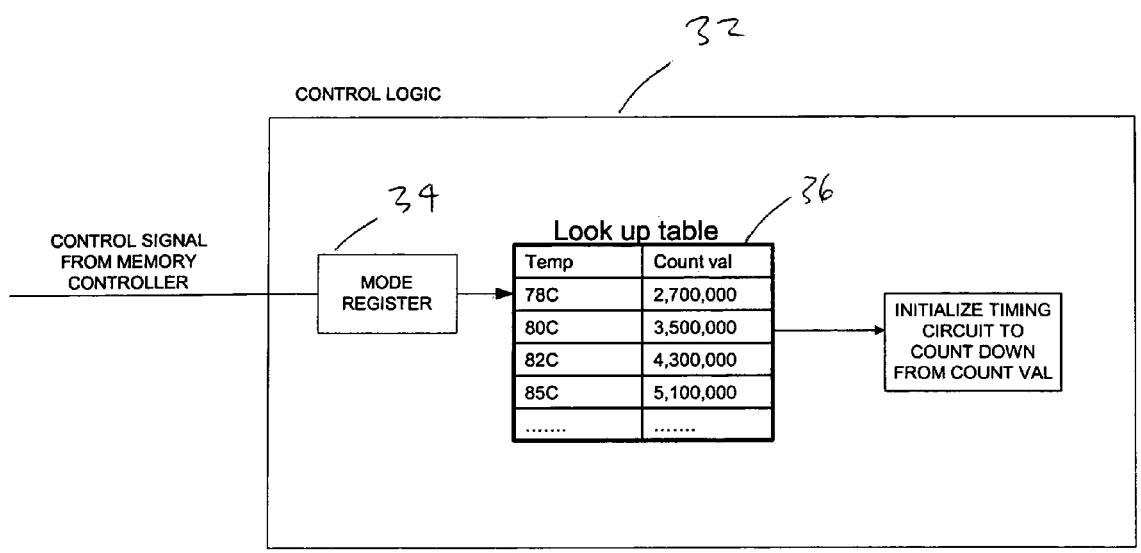
FIG. 3 shows a functional block diagram of some of the components of the control logic circuit of the memory device of FIG. 1.

From FIG. 3 of the drawings, it will be seen that the control logic 32 includes a mode register 34. In one embodiment, the mode register 34 includes a value for a trip temperature, which defines an upper limit for the operating temperature of the memory device 12. Generally, if the memory device 12 is operated at an operating temperature above the trip temperature, then failure of the memory device 12 may occur. Thus, in one embodiment, the function of the memory controller 14 is to monitor the temperature of the memory device 12, and to perform an action in order to reduce the operating temperature of the memory device 12, if it exceeds the trip temperature.

Figure 5:
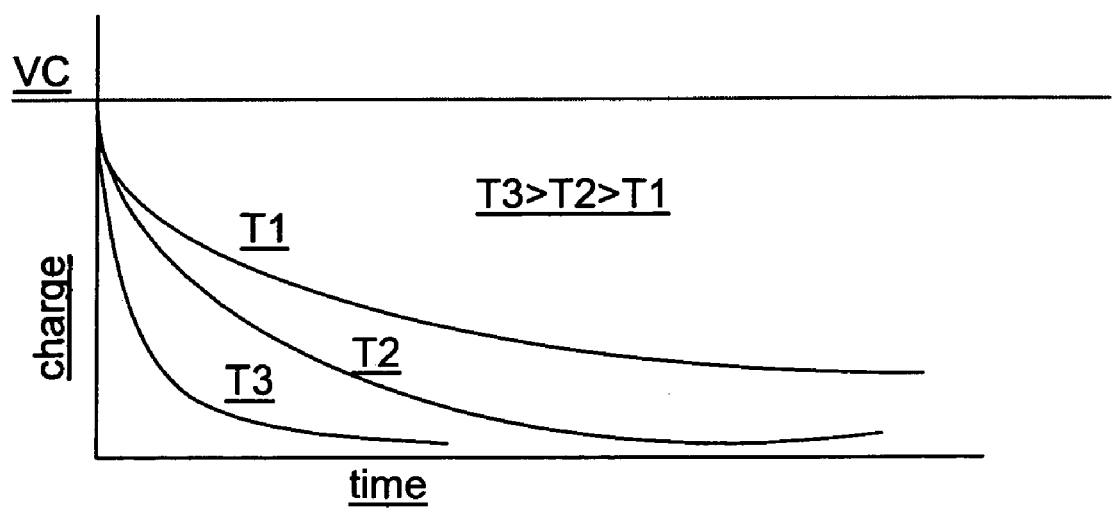
FIG. 5 is a graph showing the rate at which a capacitor discharges, at different temperatures.

In one embodiment, under control of the control logic 32, the charging circuit 26 periodically charges the capacitor 24 with a charge so that the capacitor has a potential of $V_c$. Over a period of time, charge from the capacitor 24 leaks or discharges until $V_c$ of the capacitor 24 is zero. FIG. 5 of the drawings show a graph of the discharge rate of the capacitor 24 at three different temperatures T1, T2, and T3, where T3>T2>T1, and where T1 to T3 represent the operating temperature of the memory device 12. As will be seen, the higher the operating temperature, the greater the rate at which the capacitor 24 discharges. In one embodiment, the timing circuit 28 includes a timer that counts down from a counter value, which is indicated by the trip temperature in the mode register 34. For example, if the mode register 34 has a value of 78° C. for the trip temperature, then in one embodiment, the timer of the timing circuit 28 will count down from the value 2,700,000, which is a value representing the time it would take for the capacitor 24 to discharge if the operating temperature of the memory device 12 were 78° C. One skilled in the art, would appreciate that if the operating temperature of the memory device 12 is greater than 78° C. then the capacitor 24 will discharge in a shorter time. Alternatively, if the operating temperature of the memory device 12 is less than 78° C. then the capacitor 24 will take a longer time to discharge. Accordingly, in one embodiment, under control of the control logic 32, the comparator circuit 30 compares a signal indicative of the charge left in the capacitor 24, with a signal indicative of whether the timer of the timing circuit 28 has counted down to zero. Based on the foregoing, it will be seen that if the capacitor 24 has discharged, while the timing circuit 28 is still counting down to zero then this indicates that the operating temperature of the memory device 12 exceeds the trip temperature, which was set to 78° C., in the above example. In this case, the control logic 32 generates an interrupt to the memory controller 14. The memory controller 14, includes control logic 16, which upon receiving the interrupt from the memory device 12, takes an action in order to reduce the operating temperature of the memory device 12. In one embodiment, the action may include scaling down a number of memory cycles issued to the memory device 12, in order to reduce its operating temperature.

In the above described example, the mode register 34 is programmed, with the trip temperature by a manufacturer of the memory device 12. In another embodiment of the invention, configuration logic 18 of the memory controller 14 sends a signal to the memory device 12, to program the mode register 34 with the trip temperature. Once the configuration logic 14 has programmed the mode register 34 with the trip temperature, in one embodiment the control logic 32 determines the counter value with which to initialize the timer of the timing circuit 28. In order to do this, in one embodiment, a look-up table 36 is provided as part of the control logic 32. The look-up table includes starting counter values with which to initialize the timer of the timing circuit 28 given different trip temperatures. For example, based on the look up table 36 shown in FIG. 3 of the drawings, for a trip temperature of 80° C., a counter starting value of 3,500,000 will be selected as the initial value of the timer. If the trip temperature is 85° C., it will be seen that the starting counter value will be 5,100,000. In one embodiment, the look-up table 36 is created by a manufacturer of the memory device 12, using device-specific values for each trip temperature and associated counter starting value associated with the trip temperature.

Figure 4:
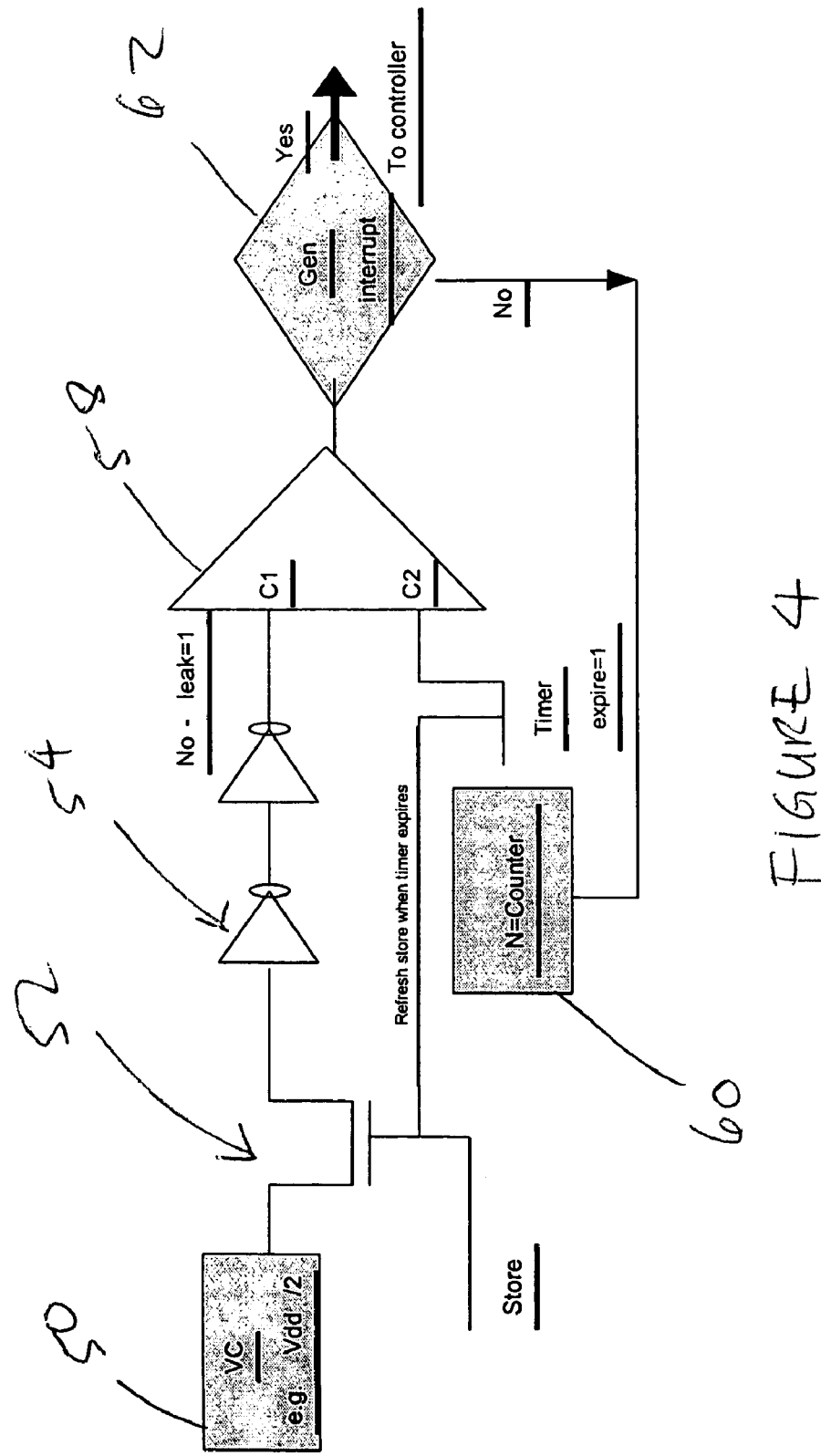
FIG. 4 shows one implementation of a circuit to implement part the functionality of the memory device of FIG. 1, in accordance with one embodiment of the invention.

One skilled in the art, would appreciate that the various circuits of the memory device 12, are shown only functionally, and that in fact some of the circuits shown in FIG. 2 may be incorporated into other circuits, or into a single circuit. FIG. 4 of the drawings shows one embodiment of a circuit that implements the function of the above described circuits of the memory device 12. Referring to FIG. 4 of the drawings the capacitor 24 of the memory device 12 is modeled as a field-effect transistor, which is shown as an NMOS device 52 in FIG. 4. A voltage source 50 is connected to the "drain" of the NMOS device 52. When the "store" pin of the NMOS device 52 is toggled to logic value 1, the gate of the NMOS device 52 opens and charge is transferred to the "source" of the NMOS device 52. Using this method, the NMOS device 52 is charged by the voltage source 50. An output of the NMOS device 52 is fed into a buffer device 54, which is connected to a comparator 58. In particular, the output of the buffer device 54 is connected to a pin C1 of the comparator 58. When the NMOS device 52 is charged, logic 1 is expected on the pin C1. When the NMOS device 52 has discharged, logic zero is expected on the pin C1 of the comparator 58.

Once the NMOS device 52 is fully charged, the CMOS device buffer 54 detects the voltage as logic 1. When the NMOS device 52 leaks out charge over time, eventually the CMOS device buffer 54 will detect the voltage as logic zero. As the NMOS device 52 leaks the charge over time, a counting device (timer) 60 counts down from a stored counter value determined by the trip temperature. The output of the counter 60 is connected to the comparator device 58, in particular to pin C2 of the comparator device 58. When the counter 60 is still counting, in other words it has not expired, logic zero is expected on the pin C2 of the comparator device 58. When the counter has expired, logic 1 is expected on the pin C2.

As will be seen, in process 62, an interrupt is generated if the capacitor has discharged (a condition indicated by logic zero on pin C1) before the counter has expired (a condition indicated by logic zero on the pin C2). For all other conditions, the interrupt is not asserted. Once the counter 60 expires, charge is restored on the NMOS device 52 by generating a store pulse and the counter value in the counter 60 is reset to start the countdown again.

Referring again to FIG. 1 of the drawings, it will be appreciated that the system 10, may itself form a subsystem for a larger system. For example, in one embodiment, the larger system may include a central processing unit (CPU) 70, which is coupled to the memory controller 14 by means of a bus 72 to define a system 74.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A method, comprising:
   periodically charging a capacitor mounted on an electronic component; initializing a timer to countdown from a counter value, once the capacitor is charged;
   determining if the capacitor has discharged before the timer has counted down to zero; and
   if the capacitor has discharged before the timer has counted down to zero then generating an interrupt.

2. The method of claim 1, wherein the electronic component comprises a memory device.

3. The method of claim 1, wherein the counter value comprises the length of time for the capacitor to discharge at an operating temperature equal to a threshold temperature for the electronic component.

4. The method of claim 1, further comprising receiving a control signal from a memory controller, and determining the counter value based on the control signal.

5. The method of claim 4, wherein the control signal comprises a trip temperature defining an upper limit for the operating temperature of the electronic component.

6. The method of claim 4, wherein determining the counter value comprises selecting the counter value from a lookup table, using the trip temperature as a key.

7. The method of claim 1, wherein the interrupt is to a memory controller.

8. A memory device, comprising:
- control logic which includes a mode register to store a trip temperature defining an upper limit for an operating temperature of the memory device;
- a capacitor to store a charge;
- a charging circuit to periodically charge the capacitor;
- a timing circuit to countdown from a counter value once the capacitor is charged, wherein the counter value is based on the trip temperature; and
- a comparator circuit to generate an interrupt if the capacitor has discharged before the timing circuit has counted down to zero.

9. The memory device of claim 8, wherein the counter value comprises the length of time for the capacitor to discharge at an operating temperature equal to the trip temperature.

10. The memory device of claim 9, wherein the control logic determines the counter value by selecting the counter value from a lookup table using the trip temperature as a key.

11. A method, comprising:
- sending a signal to a memory device to program a mode register of the memory device with a trip temperature being the upper limit for an operating temperature of the memory device; and
- if a signal is received from a memory device to indicate that the capacitor has discharged from a fully charged condition in less than the length of time indicated by the trip temperature, then performing an action to lower the operating temperature of the memory device.

12. The method of claim 11, wherein the action comprises scaling back memory cycles issued to the memory device.

13. A memory controller, comprising:
- configuration logic to send a signal to a memory device to program a mode register of the memory device with a trip temperature, being the upper limit for an operating temperature of the memory device; and
- control logic that, if a signal is received from the memory device to indicate that the capacitor has discharged from a fully charged condition in less than the length of time indicated by the trip temperature, performs an action to lower the operating temperature of the memory device.

14. The memory controller of claim 13, wherein the action comprises scaling back the number of memory cycles issued to the memory device.

15. A system, comprising:
- a memory device which includes:
    - control logic comprising a mode register to store a trip temperature, being an upper limit for an operating temperature of the memory device;
    - a capacitor to store a charge;
    - a charging circuit to periodically charge the capacitor;
    - a timing circuit to countdown from a counter value once the capacitor is charged, wherein the counter value is based on the trip temperature; and
    - a comparator circuit to generate an interrupt if the capacitor has discharged before the timing circuit has counted down to zero; and
- a memory controller to control an operation of the memory device, wherein the controller sends a signal to program the mode register with the trip temperature.

16. The system of claim 15, wherein the counter value comprises the length of time for the capacitor to discharge at an operating temperature equal to the trip temperature.

17. The system of claim 15, wherein the control logic selects the counter value from a plurality of counter values in a lookup table, each counter value comprising the length of time for the capacitor to discharge at a specific trip temperature.

18. The system of claim 15, wherein the memory controller, in response to receiving the interrupt, performs an action to reduce the operating temperature of the memory device.

19. The system of claim 18, wherein the action comprises scaling down memory cycles issued to the memory device.

* * * * *